(12) United States Patent
Liu

(10) Patent No.: US 10,345,719 B2
(45) Date of Patent: Jul. 9, 2019

(54) MASK COOLING APPARATUS AND MASK COOLING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Xuan Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/820,045

(22) Filed: Nov. 21, 2017

(65) Prior Publication Data

US 2018/0149985 A1 May 31, 2018

(30) Foreign Application Priority Data

Nov. 29, 2016 (CN) .......................... 2016 1 1073836

(51) Int. Cl.
| | | |
|---|---|---|
| *G03B 27/52* | (2006.01) | |
| *G03B 27/42* | (2006.01) | |
| *G03B 27/58* | (2006.01) | |
| *G03B 27/62* | (2006.01) | |
| *G03F 7/20* | (2006.01) | |

(52) U.S. Cl.
CPC .............................. *G03F 7/70875* (2013.01)

(58) Field of Classification Search
CPC ... F28D 2021/0028; F28F 9/001; F28F 13/06; F28F 2230/00; F28F 2265/12; F28F 27/00; F28F 3/02; F28F 3/086; F28F 9/0248; F28F 9/0256; G02F 1/133345; G02F 2201/50
See application file for complete search history.

(56) References Cited

U.S. PATENT DOCUMENTS

| | | | |
|---|---|---|---|
| 2010/0186942 A1 | 7/2010 | Phillips et al. | |
| 2014/0063476 A1* | 3/2014 | Sun ..................... | G03F 7/70716 355/30 |
| 2016/0273853 A1* | 9/2016 | Schuster .................. | G01F 1/34 |

FOREIGN PATENT DOCUMENTS

| | | |
|---|---|---|
| CN | 101140425 A | 3/2008 |
| JP | S63169027 A | 7/1988 |

(Continued)

OTHER PUBLICATIONS

The European Patent Office (EPO) The Extended European Search Report for 17203307.8 dated May 2, 2018 11 Pages.

*Primary Examiner* — Mesfin T Asfaw
(74) *Attorney, Agent, or Firm* — Anova Law Group, PLLC

(57) ABSTRACT

Mask cooling apparatus and mask cooling methods are provided. An exemplary mask cooling apparatus includes a cooler, having a cooling region, a coolant inlet region and a coolant outlet region; cooling channels, disposed in the cooling region of the cooler and used to contact with the mask; coolant inlet channels, disposed in the coolant inlet region and used to introduce a coolant in the cooling channels; and coolant outlet channels, disposed in the coolant outlet region and used to drain the coolant out from the cooling channels.

20 Claims, 3 Drawing Sheets

(56) References Cited

FOREIGN PATENT DOCUMENTS

JP         H09275070 A    10/1997
WO     2013171216 A1   11/2013

* cited by examiner

MASK COOLING APPARATUS AND MASK COOLING METHOD

CROSS-REFERENCES TO RELATED APPLICATIONS

This application claims the priority of Chinese patent application No. 201611073836.X, filed on Nov. 29, 2016, the entirety of which is incorporated herein by reference.

FIELD OF THE DISCLOSURE

The present disclosure generally relates to the field of semiconductor manufacturing technologies and, more particularly, relates to mask cooling apparatus and mask cooling methods thereof.

BACKGROUND

Photolithography is one of the most important techniques in manufacturing semiconductor devices. The photolithography is able to transfer patterns from a mask to the surface of a silicon wafer; and form a semiconductor product that meets the designed requirements. During a photolithography process, by an exposure process, exposure light passes through the transparent regions of the mask to irradiate a photoresist layer on a silicon wafer. The photoresist has a photochemical reaction with the exposure light. Then, by a developing process, using the solubility difference between the exposed and non-exposed regions of the photoresist layer, photoresist patterns are formed; and a pattern transfer process is achieved. Then, the silicon wafer is etched using the photoresist patterns as an etching mask. The patterns on the mask are transferred to the silicon wafer.

During the exposure process, the mask has a certain degree of absorption to the exposure light. With the increase of the exposure time, the temperature of the mask is gradually increased; and the mask may be deformed by the heat. Accordingly, the overlay accuracy in the exposure region of the mask is affected. With the increase of the power of the laser in the photolithography apparatus, the effect brought by the heat-induced deformation of the mask has become more and more severe. Currently, the overlay accuracy deviation caused by the temperature change in the mask is up to 5 nm.

The overlay accuracy deviation may easily change the position and size of the finally formed semiconductor structure; and the performance of the semiconductor structure is easily affected. Thus, there is a need to reduce the heat-induced deformation in the mask during the fabrication process of the semiconductor structure. The disclosed structures and methods are directed to solve one or more problems set forth above and other problems in the art.

BRIEF SUMMARY OF THE DISCLOSURE

One aspect of the present disclosure includes a mask cooling apparatus. The mask cooling apparatus includes a cooler, having a cooling region, a coolant inlet region and a coolant outlet region; cooling channels, disposed in the cooling region of the cooler and used to contact with the mask; coolant inlet channels, disposed in the coolant inlet region and used to introduce a coolant in the cooling channels; and coolant outlet channels, disposed in the coolant outlet region and used to drain the coolant out from the cooling channels.

Another aspect of the present disclosure includes a mask cooling method. The mask cooling method includes providing a mask cooling apparatus having a cooler including a cooling region, a coolant inlet region and a coolant outlet region, cooling channels disposed in the cooling region of the cooler and used to contact with the mask, coolant inlet channels disposed in the coolant inlet region and used to introduce a coolant in the cooling channels and coolant outlet channels disposed in the coolant outlet region and used to drain the coolant out from the cooling channels; attaching the cooler with a mask; introducing a coolant in the cooling channels; and exposing a photoresist layer in a photolithography process through the cooler and the mask.

Other aspects of the present disclosure can be understood by those skilled in the art in light of the description, the claims, and the drawings of the present disclosure.

DETAILED DESCRIPTION

Figure 1:
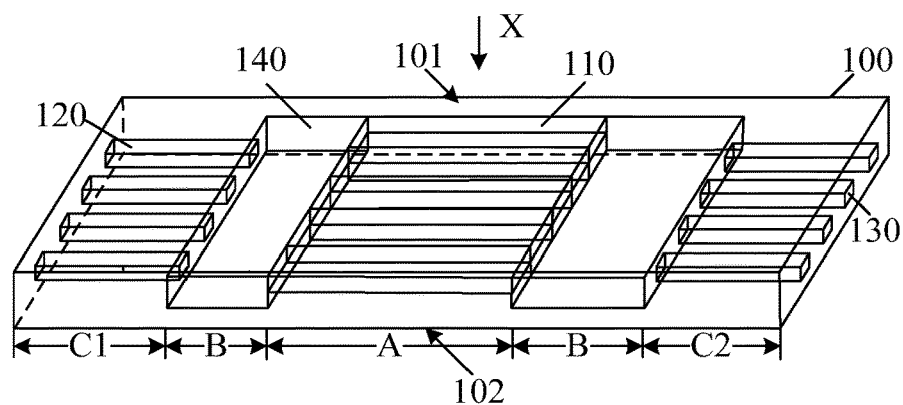
FIGS. 1-4 illustrate structures of an exemplary mask cooling apparatus consistent with the disclosed embodiments.

Reference will now be made in detail to exemplary embodiments of the disclosure, which are illustrated in the accompanying drawings. Wherever possible, the same reference numbers will be used throughout the drawings to refer to the same or like parts.

The photolithography technique may include an exposure process, a developing process and an etching process. During the exposure process, exposure light passes through the transparent region of the mask and irradiates a photoresist layer coated on a silicon wafer. The exposure light induces a photochemical reaction of the photoresist layer. During the developing process, by utilizing the solubility difference between the exposed and non-exposed regions in a developing regent, photoresist patterns are formed; and the patterns on the mask are transferred to the photoresist layer. During the etching process, the silicon wafer is etched using the patterned photoresist layer as an etching mask; and the patterns on the mask are thus transferred to the silicon wafer.

During the exposure process, the temperature of the mask is easy to increase due to the absorption of the exposure light. Thus, the mask is easy to have a heat-induced deformation. Accordingly, the patterns on the photoresist layer are easy to have deformations after the developing process. Accordingly, the patterns formed on the wafer also have a deformation; and the performance of the semiconductor structure is easily affected.

To reduce the heat-induced deformation of the mask, one approach is to calibrate the overlay accuracy deviation of the mask caused by the heat-induced deformation using a control wafer. The deviation is compensated by controlling the position of the silicon wafer.

However, the change of the overlay deviation of the mask caused by the heat-induced deformation is rather complicated, it is difficult to be totally compensated by the movement of the silicon wafer. Further, the light absorptions of different masks are different; and the heat-induced deformations in different masks are different. Thus, different compensations to different masks are required. Accordingly, the process flow of the photolithography process has to become complicated.

The present disclosure provides a mask cooling apparatus and a mask cooling method. The mask cooling apparatus may include a cooler. The cooler may include a cooling region, a coolant inlet region and a coolant outlet region. The cooling region may be attached with the mask. The cooling region may have cooling channels. Further, the cooler may have coolant inlet channels in the coolant inlet region. The coolant inlet channels may allow the coolant to enter the cooling channels. Further, the cooler may also have coolant outlet channels in the coolant outlet region. The coolant outlet channels may allow the coolant to be drained out from the cooling channels.

The cooler may be attached with the mask; and the cooler may include cooling channels. A coolant may flow in the cooling channels. During the photolithography process, the coolant may be able to carry away the heat generated in the mask; and the mask may be cooled down. Thus, the deformation of the mask may be reduced; and the overlay accuracy may be increased.

Figure 2:
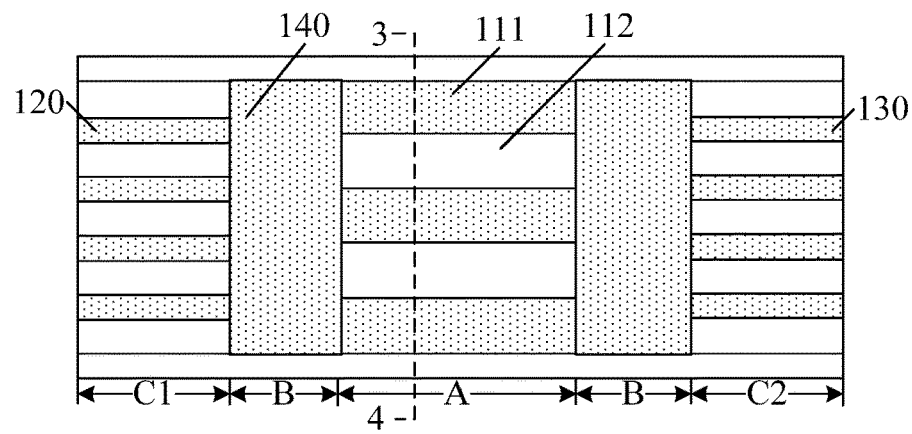
Figure 3:
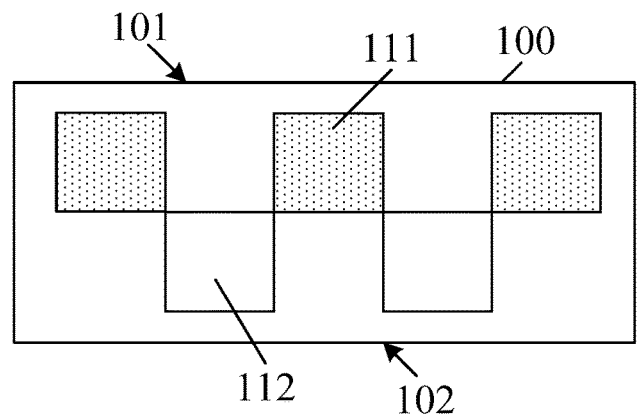

FIGS. 1-3 illustrate an exemplary mask cooling apparatus consistent with the disclosed embodiments. FIG. 2 is a top view of the structure along the "X" direction; and FIG. 3 is a cross-sectional view of the structure illustrated in FIG. 2 along the line "3-4".

As shown in FIGS. 1-3, the mask cooling apparatus may include a cooler 100. The cooler 100 may have a cooling region "A", a coolant inlet region "C1" and a coolant outlet region "C2". In one embodiment, the cooler 100 may also have a buffer region "B" between the coolant inlet region "C1" and the cooling region "A", and a buffer region "B" between the cooling region "A" and the coolant outlet region "C2", as shown in FIGS. 1-2.

The cooling region "A" may be attached with the mask. A plurality of cooling channels 110 may be disposed in the cooling region "A".

Further, a plurality of coolant inlet channels 120 may be disposed in the coolant inlet region "C1". The coolant inlet channels 120 may be used to cause a coolant to flow into the cooling channels 110.

Further, a plurality of coolant outlet channels 130 may be disposed in the coolant outlet region "C2". The coolant outlet channels 130 may be used to cause the coolant to drain out from the cooling channels 110.

The cooler 100 may be attached with the mask. The cooling channels 110 may be disposed in the cooler 100 in the cooling region "A". The coolant may flow in the cooling channels 110. Thus, during a photolithography process, the coolant may be able to carry away the heat generated in the mask; and the mask may be cooled down. Accordingly, the heater-induced deformation of the mask may be reduced; and the overlay accuracy may be increased.

In one embodiment, the cooler 100 is made of fused silica or quartz glass. Fused silica may have a sufficiently high transparency to the ultraviolet light (which may be used as the exposure light, e.g., having a wavelength of about 193 nm); and the exposure light may have substantially small energy change during the photolithography process. In some embodiments, the cooler may be made of other appropriate material that has a sufficiently high transparency to the ultraviolet light (e.g., having the wavelength of 193 nm).

In one embodiment, the cooling region "A" of the cooler 100 may be rectangular-shaped. The cooling region "A" may have a first surface 101 and a second surface 102 opposing to the first surface 101, and side surfaces (not labeled) between the first surface 101 and the second surface 102. The first surface 101 may be attached with the mask.

In one embodiment, the cooling channels 110 may be cuboids. The side surfaces of the cooling channels 110 may be parallel to the first surface 101, the second surface 102 and the side surfaces of the cooling region "A", respectively. When the exposure light irradiates the first surface 101 of the cooling region "A" perpendicularly, the exposure light may irradiate the coolant in the cooling channels 110 along the direction perpendicular to the side surfaces of the cooling channels 110. Thus, the irradiating direction of the exposure light may not be changed. Accordingly, the shapes of the exposure patterns may not be affected by the cooler 100.

The cooling region "A" of the cooler 100 and the coolant channels 110 may be both rectangular; and the side surfaces of the coolant channels 110 may be parallel to the first surface 101, the second surface 102 and the side surfaces of the cooler 100, respectively. Thus, during the photolithography process, the first surface 101 of the cooler 100 may be perpendicular to the exposure light. Accordingly, the side surfaces of the cooling channels 110 parallel to the first surface 101 may be perpendicular to the exposure light. Therefore, the direction change of the exposure light caused by the refractive index difference between the coolant and the cooler 100 may be reduced; and the overlay accuracy may be increased.

Specifically, in one embodiment, the cross-sections of the cooling channels 110 may be a square. In some embodiments, the cross-sections of the cooling channel may be rectangular.

In one embodiment, the coolant is water or any suitable coolant(s). Water may have a relatively large transparency to ultraviolet light. In some embodiments, the coolant may be other appropriate material that has a relatively large transparency to the ultraviolet light.

The length of the cooling channels 110 may be any appropriate value. If the length of the cooling channels 110 is too large, bubbles may be easily formed in the coolant. The exposure light may be easy to have a refraction on the interface between the bubbles and the coolant; and the direction of the exposure light may change. Accordingly, the photoresist patterns may be easily affected; and the overlay accuracy may be reduced. If the length of the cooling channels 110 is too small, the cooling efficiency may be reduced. In one embodiment, the length of the cooling channels may need to be properly designed.

Specifically, to reduce the fluctuation in the coolant, in one embodiment, the coolant may be at a laminar flow condition. That is, the Reynolds number is smaller than 2000.

The equation for calculating the Reynolds number Re is: $Re = \upsilon D/V$. $\upsilon$ denotes the flow rate of the coolant. D denotes the hydraulic diameter of the cooling channel. V denotes the viscosity of the coolant. Combining the practical conditions, the hydraulic diameter D of the coolant channel may be determined.

The flow rate of the coolant may be any appropriate value. If the flow rate of the coolant is too large, the cooling apparatus may need relatively high requirements. If the flow rate of the coolant is too small, the cooling efficiency may be reduced. In one embodiment, the flow rate u of the coolant may be in a range of approximately 0.4 m/s-0.66 m/s.

In one embodiment, the coolant is water. The temperature of the coolant is in a range of approximately 18° C.-25° C. The viscosity of the coolant may be approximately 1E-6 $m^2/s$.

To cause the coolant to be at the laminar flow state, e.g., the Reynolds number Re is smaller than 2000, and ensure the cooling channels to be uneasy to have bubbles inside, the diameter of the cooling channels 110 may need to be in an appropriate range. In one embodiment, the hydraulic diameter "D" of the cooling channels 110 may be in a range of approximately 3 mm-5 mm.

In one embodiment, the cross-section of the cooling channel 100 is square-shaped, and the four surfaces of the cooling channel 100 may be all wetted. Thus, the hydraulic diameter "D" of the cooling channel 110 may be equal the length of the side of the square, i.e., the length of the side of the cross-section of the cooling channel 110. That is, the length of the side of the cooling channel 110 (the square) may be in a range of approximately 3 mm-5 mm, such as 3.5 mm, 4 mm, and 4.5 mm, etc.

Referring the FIG. 3, in one embodiment, the cooling region "A" may include a first cooling region (not labeled) and a second cooling region (not labeled). The first cooling region and the second cooling region may be aligned along a direction perpendicular to the first surface 101.

For example, the cooling channels 110 may include first cooling channels 111 in the first cooling region; and second cooling channels 112 in the second cooling region. The projections of the side surfaces of the first cooling channels 111 on the first surface 101 and the projections of the side surfaces of the second cooling channels 112 on the first surface 101 may be adjacent, and may contact with each other. The size of the first cooling channel 111 along a direction perpendicular to the first surface 101 may be substantially equal to the size of the second cooling channel 112 along the direction perpendicular to the first surface 101.

The projections of the side surfaces of the first cooling channels 111 on the first surface 101 and the projections of the side surfaces of the second cooling channels 112 on the first surface 101 may be adjacent and may contact with each other; and the size of the first cooling channel 111 along a direction perpendicular to the first surface 101 may be substantially equal to the size of the second cooling channel 112 along the direction perpendicular to the first surface 101. Such configurations may be able to ensure the exposure light to have a same optical path and a same phase change during the process that the exposure light irradiates the cooler 100 from all positions of the first surface 101 and leaves the cooler from the second surface 102. Accordingly, the exposure light may be uneasy to have an interference at the surface of the photoresist layer to distort the photolithography patterns. Thus, the overlay accuracy may be increased.

In one embodiment, the number of the first cooling channels 111 is three; and the number of the second cooling channels 112 is two. In some embodiments, the number of the first cooling channels and the number of the second cooling channels may be other appropriate values.

In one embodiment, the coolant is water. The exposure light may be ultraviolet light. Water may have a sufficiently high transparency to the ultraviolet light. In some embodiments, the coolant may be other appropriate material that has a sufficiently high transparency to the ultraviolet light.

In one embodiment, the cross-section of the coolant inlet channel 120 may be rectangular. In some embodiments, the cross-section of the coolant inlet channel may be circular.

In one embodiment, the coolant inlet region "C1" of the cooler 100 is a cuboid. In some embodiments, the coolant inlet region of the cooler 100 may be a cylinder.

In one embodiment, the cross-section of the coolant outlet channel 130 is square-shaped. In some embodiments, the cross-section of the coolant outlet channel may be circular-shaped, or rectangular shaped.

In one embodiment, the coolant outlet region "C2" of the cooler 100 is a cuboid. In some embodiments, the coolant outlet region of the cooler 100 may be a cylinder.

In one embodiment, the cooler 100 may include the buffer regions "B" between the coolant inlet region "C1" and the cooling region "A" and between the cooling region B and the coolant outlet region "C2", respectively. A buffer channel 140 may be disposed in the buffer region "B".

In one embodiment, the total area of the cross-sections of the buffer channels 140 may be greater than the total area of the cross-sections of the cooling channels 110. The total area of the cross-sections of the buffer channels 140 may also be greater than the total area of the cross-sections of the coolant inlet channels 120.

In some embodiments, the total area of the cross-sections of the buffer channels 140 may be substantially equal to the total area of the cross-sections of the cooling channels 110.

In one embodiment, the number of the buffer channels 140 is one. The total area of the cross-sections of the buffer channels 140 may be the area of the cross-section of the buffer channel 140.

In one embodiment, the number of the coolant inlet channels 120 may be greater than one; and the number of the cooling channels 110 may be greater than one. Thus, the area of the cross-section of the buffer channel 140 may be greater than the total area of the cross-sections of the plurality of cooling channels 110; and the area of the cross-section of the buffer channel 140 may be greater than the total area of the cross-sections of the plurality of coolant inlet channels 120.

The buffer channel 140 may be disposed in the buffer region "B"; and the total area of the cross-sections of the buffer channels 140 may be greater than the total area of the cross-sections of the coolant inlet channels 120. Thus, when the coolant enters into the buffer channel 140 through the coolant inlet channels 120, because the area of the cross-section of the buffer channel 140 may be sufficiently large, the flow rate of the coolant may be reduced; and the coolant may be easily at the laminar flow state. Thus, the adverse effect to the irradiation direction of the exposure light may be reduced. Further, the area of the cross-section of the buffer channel 140 may be greater than the total area of the cross-sections of the cooling channels 110, it may be uneasy to form bubbles in the coolant after the coolant in the buffer channel 140 enters into the cooling channels 110. Thus, the light direction change caused by the bubbles may be reduced; and the photolithography patterns may not be easily changed.

In one embodiment, the cross-section of buffer channel 140 is rectangular-shaped. In some embodiments, the cross-section of the buffer channel may be circular-shaped.

Further, the mask cooling apparatus may also include a fixed pipe (not shown). The fixed pipe may be used to supply the coolant to the cooler 100.

In one embodiment, the cross-section of the fixed pipe may be circular-shaped. In some embodiments, the cross-section of the fixed pipe may be rectangular-shaped.

Figure 4:
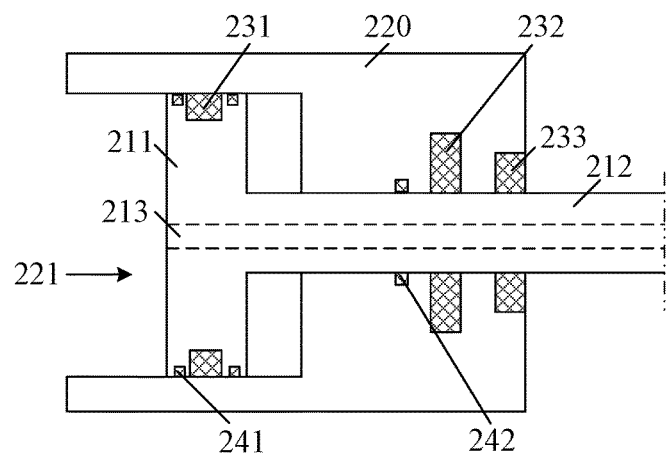

Further, as shown in FIG. 4, the mask cooling apparatus may also include a connector (not labeled). The connector may be used to connect the cooler 100 (referring to FIG. 1) with the fixed tube.

The connector may be able to connect the fixed tube with the cooler 100 by a movable connection, i.e., the connector is movable relative to the fixed tube. The connector may be used to move the cooler 100 along the length direction of the fixed tube; and to ensure the cooler 100 to move with the mask.

In one embodiment, the connector may include a first connecting portion (not labeled) and a second connecting portion 220. The first connecting portion may be connected with the coolant inlet region C1 (referring to FIG. 1) of the cooler 100 by a fixed connection, i.e., unmovable relative to the cooler 100. The second connector portion 220 may be connected with the fixed pipe by a fixed connection.

As shown in FIG. 4, the second connecting portion 220 may include a first hole 221 and a second hole (not labeled). The inner side surface of the first hole 221 may be connected with the fixed pipe by a fixed connection. The second hole and the first hole 221 may be connected through. The second hole and the first hole 221 may be through the second connecting portion 220. The diameter of the first hole 221 may be greater than the diameter of the second hole.

In one embodiment, the first connecting portion may include a coolant inlet connecting pipe 212. The coolant inlet connecting pipe 212 may be connected with the coolant inlet region C1 of the cooler 100 by a fixed connection. The coolant inlet connecting pipe 212 may be through the second hole of the second connecting portion. The first connecting portion may also include a position-limiting pipe 211. The position-limiting pipe 211 may be connected with the coolant inlet connecting pipe by a fixed connection. The connection region between the position-limiting pipe 211 and the coolant inlet connecting pipe 212 may have a coolant inlet hole 213. The coolant inlet hole 213 may be through the position-limiting pipe 211 and the coolant inlet connecting pipe 212. The coolant inlet hole 213 may be connected to the coolant inlet channels 120. The position-limiting pipe 211 may be disposed inside the first hole 221; and the position-limiting pipe 211 may contact with the inner side surface of the first hole 221.

In one embodiment, the cross-section of the coolant inlet connecting pipe 212 may be circular-shaped. In some embodiments, the cross-section of the coolant inlet connecting pipe may be square-shaped.

In one embodiment, the coolant inlet connecting pipe 212 and the inner side surface of the second hole may be connected by a sealing connection. The position-limiting pipe 211 and the inner side surface of the first hole 221 may be connected by a sealing connection.

The first connecting portion 220 may be able to move in the first hole 221 along the axis of the first hole 221. Such a motion may allow the cooler 100 to move along the axis of the cooling channels 110.

In one embodiment, as shown in FIG. 4, a first sealing piston 231 may be disposed in the side surface of the position-limiting pipe 211. The first sealing piston 231 may contact with the side surface of the first hole 221.

The first sealing piston 231 may be able to increase the air-tight property between the side surface of the first hole 221 and the position-limiting pipe 211; and the leakage of coolant in the first hole 221 may be prevented.

In one embodiment, the first sealing piston 231 may be ring-shaped.

In one embodiment, the first sealing piston 231 may be one or more of a polyurethane sealing ring and a rubber elastomer sealing ring, etc. Specifically, in one embodiment, the first sealing piston 231 includes a polyurethane sealing ring and a rubber elastomer sealing ring. The polyurethane sealing ring may contact with the side surface of the first hole 221.

In one embodiment, the connector may also include a second sealing piston 232. The second sealing piston 232 may be in the inner side surface of the second hole enclosed by the second connecting portion 220. The second sealing piston 232 may contact with the side surface of the coolant inlet connecting pipe 212.

In one embodiment, the second sealing piston 232 may include a rubber elastomer sealing ring and a bronze-filled polyfluortetraethylene (PTFE) ring. Specifically, the second sealing piston 232 includes the rubber elastomer sealing ring and the bronze-filled polyfluortetraethylene (PTFE) ring. The rubber elastomer sealing ring and the bronze-filled polyfluortetraethylene (PTFE) ring may contact with each other. The bronze-filled polyfluortetraethylene (PTFE) ring may contact with the coolant inlet connecting pipe 212.

In one embodiment, as shown in FIG. 4, an anti-dirt sealing piston 233 may be disposed in the inner surface of the second connecting portion 220 enclosing the second hole. The anti-dust sealing piston 233 may contact with the side surface of the coolant inlet connecting pipe. Further, the anti-dirt sealing piston 233 may contact with air.

The anti-dirt sealing piston 233 may be used to isolate the first hole 221 from air; and prevent the dust in the air from contaminating the coolant in the first hole 221.

In one embodiment, as shown in FIG. 4, the connector may also include a first supporting ring 241 and/or a second supporting ring 242. Specifically, the connector may include the first supporting ring 241 and the second supporting ring 242.

In one embodiment, the first supporting ring 241 may be disposed in the position-limiting pipe 211. The first supporting ring 241 may contact with the side surface of the first hole 221.

The first support ring 241 may be used to support the side of the first hole; and prevent the second connecting portion from having a deformation. Thus, a uniform liquid pressure distribution on the side surface of the first hole 221 may be ensured.

Thus, in the disclosed mask cooling apparatus, the cooler may be attached to the mask; and a plurality of the cooling channels may be disposed in the cooler. A coolant may flow inside the cooling channels. During a photolithography process, the coolant may be able to carry away the heat generated by the mask. Thus, the mask may be cooled down; and the deformation caused by the heat generated by the exposure light may be reduced. Accordingly, the overlay accuracy of the mask may be enhanced.

Further, the projection of the side surfaces of the second cooling channels on the first surface and the projection of the side surface of the first cooling channel on the first surface may be adjacent to each other and may connect with each other. The size of the first cooling channel along the direction perpendicular to the first surface and the size of the second cooling channel along the direction perpendicular to the first surface may be substantially identical. Thus, when the exposure light irradiates from all the positions of the first surface; and leave the second surface, the optical path of the exposure light may be substantially same, the phase change of the exposure light may be substantially same. Thus, it may be uneasy to cause the distortion of the photolithography patterns when the exposure light has an interference on the surface of the photoresist.

Further, the cooler may have buffer regions. Buffer channels may be disposed in the buffer regions; and the total area of the cross-sections of the buffer channels may be greater than the total area of the cross-sections of the coolant inlet channels. When the coolant enters the buffer channels from the coolant inlet channels, because the total area of the cross-sections of the buffer channels may be relatively large, the flow rate of the coolant may be reduced. A stable laminar flow can be achieved. Further, because the total area of the cross-sections of the buffer channels may be greater than the total area of the cross-sections of the coolant inlet channels, it may be uneasy to cause the coolant to form bubbles after the coolant in the buffer channels enters the cooling channels. Thus, the light transmit direction may not be changed; and the photolithography patterns may be uneasily changed.

Figure 5:
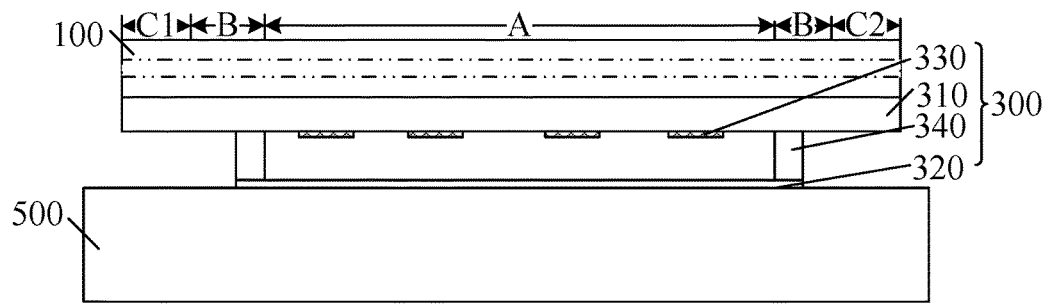
FIGS. 5-7 illustrate an exemplary mask cooling method consistent with the disclosed embodiments.
Figure 6:
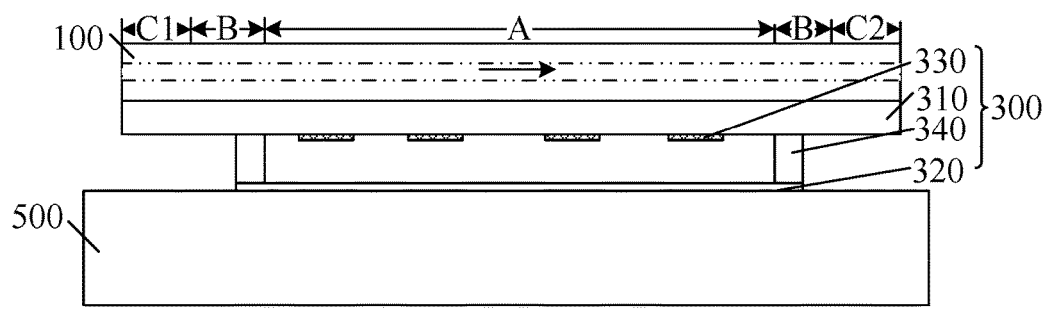
Figure 7:
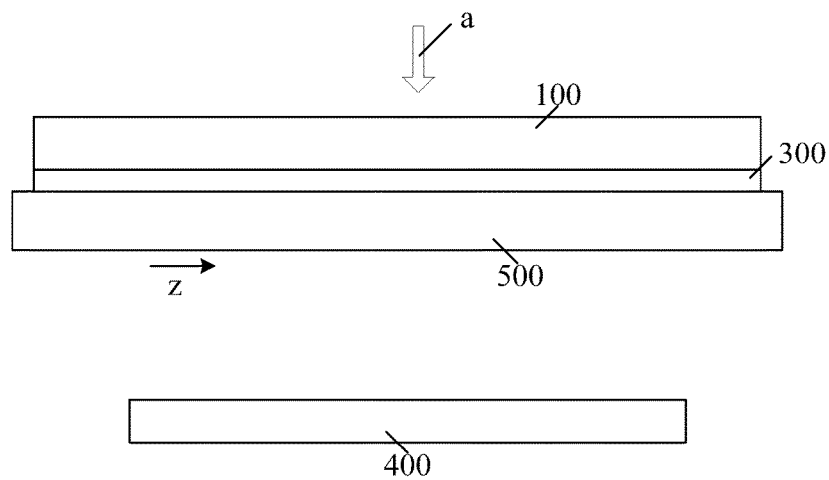
Figure 8:
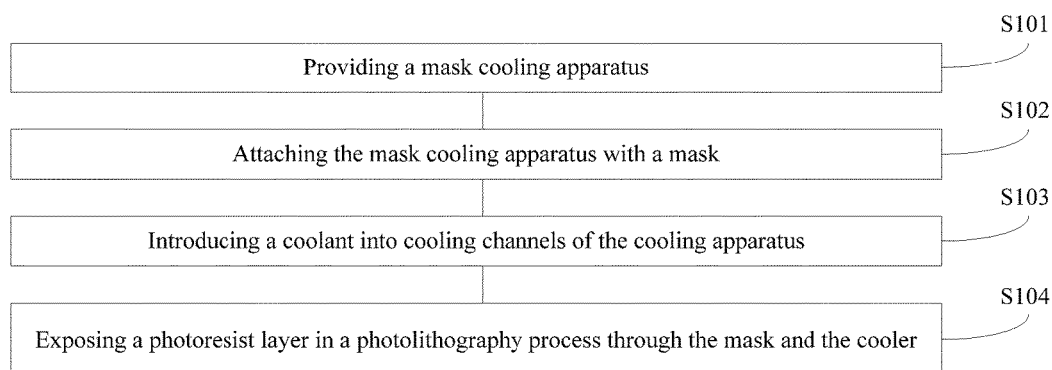
FIG. 8 illustrates another exemplary mask cooling method consistent with the disclosed embodiments.

FIG. 8 illustrates an exemplary mask cooling method consistent with the disclosed embodiments. FIGS. 5-7 illustrate structures corresponding to certain stage of the exemplary mask cooling method.

As shown in FIG. 8, at the beginning of the mask cooling method, a mask cooling apparatus, a photoresist layer and a mask are provided (S101). FIG. 5 illustrates a corresponding structure.

As shown in FIG. 5, a mask cooling apparatus (not labeled), a photoresist layer (not shown) and a mask 300 are provided.

The mask cooling apparatus may be the disclosed mask cooling apparatus. In some embodiments, the mask cooling apparatus may be other appropriate mask cooling apparatus.

In one embodiment, the photoresist layer may be on a wafer (not shown).

In one embodiment, as shown in FIG. 5, the mask 300 may include a supporting plate 310. The supporting plate 310 may include a first plate surface and a second plate surface, opposing to each other. The supporting plate 310 may include a pattern region and a connecting region around the pattern region. The mask 300 may also include a pattern layer 330. The pattern layer 330 may contact with the second plate surface of the supporting plate 310. Further, the mask 300 may also include a supporting frame 340. The supporting frame 340 may contact with the second plate surface; and may locate in the connecting region. Further, the mask 300 may also include a protection layer 320. The protection layer 320 may cover the pattern layer 330.

In one embodiment, the supporting plate 310 may be made of fused silica or quartz. Fused silica may have a sufficiently high transparency to ultraviolet light, and a relative small absorbance to the exposure light. The supporting plate 310 may be used to support the pattern layer 330. In some embodiments, the supporting plate may be made of any other appropriate material.

In one embodiment, the pattern layer 330 may be made of Cr. Cr may have an acceptable absorbance to the ultraviolet light (i.e., the exposure light) and a low transparency to the ultraviolet light. The pattern layer 330 may be able to prevent portions of the exposure light from passing through the mask 300. In some embodiments, the pattern layer may be made of other appropriate material, such as Ni, etc.

In one embodiment, the thickness of the mask 300 may be in a range of approximately 4 mm-6 mm.

The protection layer 320 may be used to reduce the contaminations to the pattern layer 330 from the external environments.

After providing the mask cooling apparatus, the photoresist layer and the mask 300, a mask stage 500 may be provided. The middle of the mask stage is opened for the light to pass.

The mask stage 500 may be used to hold the mask 300 and the cooler 100. The opened region of the mask stage 500 may allow the exposure light to pass through the mask stage 500 to irradiate the photoresist layer.

Returning to FIG. 8, after providing the mask cooling apparatus, the photoresist layer, the mask, and the mask stage, the cooler and the mask may be attached together (S102). FIG. 5 illustrates a corresponding structure.

As shown in FIG. 5, the cooler 100 and the mask 300 may be attached together.

In one embodiment, the process for attaching the cooler 100 and the mask 300 together may include placing the mask 300 on the mask stage 500, followed by placing the cooler on the mask 300.

In one embodiment, the process for disposing the cooler on the mask 300 may include attaching the cooler 100 with the supporting plate 310. The cooling region A of cooler 100 may be attached to the supporting plate 300.

Returning to FIG. 8, after attaching the cooler and the mask, a coolant may be provided (S103). FIG. 6 illustrates a corresponding structure.

As shown in FIG. 6, a coolant (not labeled) may be provided. The coolant may be introduced or filled into the cooling channels 110 (referring to FIG. 1).

In one embodiment, the subsequently used exposure light may be ultraviolet light at a wavelength of 193 nm, the coolant may be water. Water may have a relatively high transparency to the ultraviolet light. Thus, the energy loss of the ultraviolet light in the coolant may be reduced. In some embodiments, the coolant may be other appropriate material which has a sufficiently high transparency to the ultraviolet light.

The process for introducing or filling the coolant into the cooling channels 110 may include introducing the coolant into the cooling channels 120 (referring to FIG. 1) and the buffer channel 140 (referring to FIG. 1) through the fixed pipe; and drain the coolant out through the coolant outlet channels 130.

In one embodiment, the coolant may be circulated in the cooling channels 110. The heat generated by the mask 200 may be carried away by the circulating coolant. Thus, the cooling of the mask 300 may be achieved.

The cooler 100 may be attached with the mask 300; and the coolant may be filled in the cooling channels 110. The coolant may be able to flow in the cooling channels 110. Thus, the coolant may be able to carry away the heat generated in the mask 300 during the photolithography process. Accordingly, the mask 300 may be cooled down; and the heat-induced deformation of the mask 300 may be reduced. Thus, the overlay accuracy may be increased.

The flow rate of the coolant may be any appropriate value. If the flow rate of the coolant is too large, the mask cooling apparatus may have higher requirements. If the flow rate of the coolant is too small, the cooling efficiency of the mask cooling apparatus may be reduced. In one embodiment, the flow rate of the coolant may be in a range of approximately 0.4 m/s-0.66 m/s.

To reduce the fluctuation of the coolant, in one embodiment, the coolant may be at the laminar flow status. That is, the Reynolds number of the coolant may be smaller than 2000. Thus, the side length of the cooling channel may be in a range of approximately 3 mm-5 mm, such as 3.5 mm, 4 mm, or 4.5 mm, etc.

The heat flux density of the energy exchange between the coolant and the mask 300 is:

$$q=h^*(T_s-T_f)$$

where q denotes the heat flux density, i.e., the heat exchanged between a unit area of the surface of mask and the coolant in a unit time. h denotes the surface convective heat transfer coefficient. $T_s$ denotes the temperature of the mask 300. $T_f$ denotes the temperature of the coolant.

The convective heat transfer coefficient "h" and the Reynolds number "Re" may have a correlation. In one embodiment, the mask 300 may be self-cooled by the coolant. When the Reynolds number is smaller than 2000, the convective heat transfer coefficient "h" may be in a range of approximately 200 W/(m²*K)-1000 W/(m²*K). When the mask 300 is naturally convectively cooled in air, the convective heat transfer coefficient "h" may be in a range of approximately 5 W/(m²*K)-24 W/(m²*K). Thus, the disclosed mask cooling apparatus may be able to increase the cooling rate up to approximately 40 times to 200 times.

In one embodiment, the temperature of the coolant is the room temperature. That is, the temperature of the coolant may be in a range of approximately 18° C.-25° C., such as 20° C., etc.

Returning to FIG. 8, after introducing the coolant in the cooling channels, an exposure process may performed (S104). FIG. 7 illustrates a corresponding structure.

As shown in FIG. 7, an exposure process may be performed on the photoresist layer 400 through the mask 300 and the cooler 100 in a photolithography process.

The exposure process may be able to transfer the patterns on the mask 300 to the photoresist layer 400. Photolithography patterns may be formed on the photoresist layer 400.

As shown in FIG. 7, the exposure process may include using the exposure light "a" to irradiate the photoresist layer 400 through the cooler 100 and the mask 300. That is, the exposure light "a" passes through the cooler 100 and the mask 300.

In one embodiment, the exposure light "a" is an ultraviolet light. Specifically, the wavelength of the exposure light "a" is approximately 193 nm.

In one embodiment, during the exposure process, the mask 300 and the cooler 100 may move relative to the exposure light "a" so as to allow the exposure light "a" to scan the pattern region of the entire mask 300.

In one embodiment, the moving direction of the mask 300 and the cooler 100 may be the same as the flowing direction of the coolant in the cooling channels 110 (referring to FIG. 1).

The moving direction of the mask 300 and the cooler 100 being the same as the flowing direction of the coolant in the cooling channels 110 may be able to cause the coolant in the cooling channels 110 at the laminar flow status. Thus, the fluctuation of the coolant may be reduced. Accordingly, the effect of the coolant on the direction of the exposure light may be reduced; and the overlay accuracy of the formed photolithography patterns may be ensured.

Thus, in the disclosed method for using the mask cooling apparatus, the cooler may be attached with the mask; and the coolant may be filled in the cooling channels. The coolant may flow in the cooling channels. Thus, the coolant may carry away the heat generated in the mask during the photolithography process. Accordingly, the mask may be cooled down; the deformation of the mask may be reduced; and the overlay accuracy may be increased.

Further, during the photolithography process, the moving direction of the mask and the cooler may be the same as the flowing direction of the coolant in the cooling channels. Thus, the coolant in the cooling channel may be at the laminar flow status. Accordingly, the fluctuation of the coolant may be reduced; and the effect of the coolant on the direction of the exposure light may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A mask cooling apparatus, comprising:
a cooler, having a cooling region, a coolant inlet region and a coolant outlet region, wherein the cooling region of the cooler is a cuboid and the cooling region of the cooler has a first surface, a second surface opposing to the first surface, and side surfaces between the first surface and the second surface;
cooling channels, disposed in the cooling region of the cooler and used to contact with a mask, wherein:
the cooling channel is a cuboid and includes first cooling channel and second cooling channel,
side surfaces of the cooling channels are parallel to the side surfaces of the cooling region and
projections of side surfaces of the first cooling channels on the first surface and projections of side surfaces of the second cooling channels on the first surface are adjacent to each other and edges of the projections of side surfaces of the first cooling channels on the first surface and edges of the projections of side surfaces of the second cooling channels on the first surface contact with each other;
coolant inlet channels, disposed in the coolant inlet region and used to introduce a coolant in the cooling channels; and
coolant outlet channels, disposed in the coolant outlet region and used to drain the coolant out from the cooling channels.

2. The mask cooling apparatus according to claim 1, wherein:
the cooler is made of one of quartz and fused silica.

3. The mask cooling apparatus according to claim 1, wherein:
the first surface is used to attach with the mask; and
bottom/top surfaces of the cooling channels are parallel to the first surface and the second surface.

4. The mask cooling apparatus according to claim 3, wherein:
the cooling region includes a first cooling region and a second cooling region;
the first cooling region and the second cooling region are aligned along a direction perpendicular to the first surface;
the cooling channels include the first cooling channels disposed in the first cooling region and the second cooling channels disposed in the second cooling region, wherein the first cooling channels and the second cooling channels alternates in a direction perpendicular to the side surfaces of the cooling region; and
a size of the first channel along a direction perpendicular to the first surface is substantially identical to a size of the second channel along the direction perpendicular to the first surface.

5. The mask cooling apparatus according to claim 4, wherein:
a number of the first cooling channels is equal to, or greater than one; and
a number of the second cooling channels is equal to, or greater than one.

6. The mask cooling apparatus according to claim 4, wherein:

a cross-section of the first cooling channel is square-shaped;
a cross-section of the second cooling channel is square-shaped;
a length of a side of the cross-section of the first cooing channel is in a range of approximately 3 mm-5 mm; and
a length of a side of the cross-section of the second cooling channel is in a range of approximately 3 mm-5 mm.

7. The mask cooling apparatus according to claim 1, wherein:
a cross-section of the coolant outlet channel is one of square-shaped and circular shipped; and
a cross-section of the coolant inlet channel is one of square-shaped and circular shipped.

8. The mask cooling apparatus according to claim 1, further comprising:
a buffer region between the coolant inlet region and the cooling region; and
a buffer region between the cooling region and the coolant outlet region.

9. The mask cooling apparatus according to claim 1, wherein:
a total area of cross-sections of the buffer channels is greater than a total area of cross-sections of the cooling channels; and
the total area of the cross-sections of the buffer channels is greater than a total area of cross-sections of the coolant inlet channels,
wherein:
the total area of the cross-sections of the buffer channels denotes a total area of the cross-sections of all the buffer channels;
the total area of the cross-sections of the cooling channels denotes a total area of the cross-sections of all the cooling channels; and
the total area of the cross-sections of the coolant inlet channels denotes a total area of the cross-sections of all the coolant inlet channels.

10. The mask cooling apparatus according to claim 1, further comprising:
a fixed pipe, used to supply the coolant to the cooler; and
a connector, used to connect the cooler with the fixed pipe.

11. The mask cooling apparatus according to claim 10, wherein:
the connector moves along a length direction of the fixed pipe.

12. The mask cooling apparatus according to claim 10, wherein the connector comprises:
a first connecting portion, connected to the coolant inlet region of the cooler with a fixed connection;
a second connecting portions, connected with the fixed pipe with a fixed connection;
wherein:
the first connecting portion and the second connecting portion are connected by a fixed connection;
the second connecting portion has a first hole and a second hole;
a diameter of the first hole is greater than a diameter of the second hole;
the first hole and the second hole are connected;
the second hole is through the first hole;
the first connecting portion includes a coolant inlet connecting pipe and a position-limiting pipe;
the coolant inlet connecting pipe and the coolant inlet region of the cooler are connected by a fixed connection;
the coolant inlet connecting pipe is through the second hole;
the position-limiting pipe is connected to the coolant inlet connecting pipe;
the position-limiting pipe and the coolant inlet connecting pipe have coolant inlet holes;
the coolant inlet holes are through the position limiting pipe and the coolant inlet connecting pipe;
the coolant inlet hole and the coolant inlet channel are connected through;
the position-limiting pipe is disposed in the first hole; and
the position-limiting pipe contacts with a side surface of the first hole.

13. The mask cooling apparatus according to claim 12, wherein the connector further comprises:
one or more of a first sealing piston and a second piston, wherein:
the first sealing piston is disposed in the position-limiting pipe and contacts with a side surface of the first hole; and
the second sealing piston is disposed in a side surface of the second connecting portions enclosing the second hole and contacts with the second coolant inlet/outlet pipe.

14. The mask cooling apparatus according to claim 13, wherein:
the first sealing piston includes one or more of a polyurethane sealing ring and rubber elastomer sealing ring; and
the second sealing piston includes one or more of a rubber sealing ring and bronzed-filled polyfluortetraethylene (PTFE) ring.

15. The mask cooling apparatus according to claim 12, wherein:
an anti-dust sealing ring is disposed in the second connecting portion enclosing the second hole;
the anti-dust sealing ring contacts with a side surface of the coolant inlet connecting pipe and air.

16. The mask cooling apparatus according to claim 12, wherein the connector
further comprises:
one or more of a first supporting ring and a second supporting ring,
wherein:
the first supporting ring is disposed in the position-limiting pipe and contacts with a side surface of the first hole; and
the second supporting ring is disposed in the second connecting portion enclosing the second hole and contacts with the coolant inlet/outlet pipe.

17. A mask cooling method, comprising:
providing a mask cooling apparatus having a cooler including a cooling region, wherein the cooling region of the cooler is a cuboid and the cooling region of the cooler has a first surface, a second surface opposing to the first surface, and side surfaces between the first surface and the second surface, a coolant inlet region and a coolant outlet region, cooling channels disposed in the cooling region of the cooler and used to contact with the mask, wherein: the cooling channel is a cuboid and includes first cooling channel and second cooling channel, side surfaces of the cooling channels are parallel to the side surfaces of the cooling region and projections of side surfaces of the first cooling channels on the first surface and projections of side surfaces of the second cooling channels on the first surface are adjacent to each other and edges of the projections of side surfaces of the first cooling channels on the first surface and edges of the projections of side surfaces of the second cooling channels on the first surface contact with each other, coolant inlet channels disposed in the coolant inlet region and used to introduce a coolant in the cooling channels and coolant outlet channels disposed in the coolant outlet region and used to drain the coolant out from the cooling channels;

attaching the cooler with a mask;

introducing a coolant in the cooling channels; and exposing a photoresist layer in a photolithography process through the cooler and the mask.

18. The mask cooling method according to claim 17, wherein:

a flow direction of the coolant in the channels is parallel to a moving direction of the mask and the cooler during the photolithography process.

19. The mask cooling method according to claim 17, wherein:

a Reynolds number of the coolant in the cooling channels is smaller than 2000.

20. The mask cooling method according to claim 17, wherein:

the coolant is water or liquids having a high transmittance at 193 nm.

* * * * *